(12) United States Patent
Figov et al.

(10) Patent No.: US 8,507,182 B2
(45) Date of Patent: Aug. 13, 2013

(54) METHOD OF PROVIDING LITHOGRAPHIC PRINTING PLATES

(75) Inventors: Murray Figov, Ra'anana (IL); Moshe Marom, Herzlia (IL); Ilan Levi, Natanya (IL)

(73) Assignee: Eastman Kodak Company, Rochester, NY (US)

( * ) Notice: Subject to any disclaimer, the term of this patent is extended or adjusted under 35 U.S.C. 154(b) by 872 days.

(21) Appl. No.: 12/481,002

(22) Filed: Jun. 9, 2009

(65) Prior Publication Data
US 2010/0310989 A1    Dec. 9, 2010

(51) Int. Cl.
*G03F 7/00* (2006.01)
*G03F 7/26* (2006.01)
*B41N 1/00* (2006.01)

(52) U.S. Cl.
USPC ........................................ 430/302; 101/463.1

(58) Field of Classification Search
USPC ................... 430/270.1, 302; 101/450.1, 453, 101/463.1
See application file for complete search history.

(56) References Cited

U.S. PATENT DOCUMENTS

| | | | | |
|---|---|---|---|---|
| 4,436,902 A * | 3/1984 | Wood et al. | | 528/501 |
| 6,482,578 B2 * | 11/2002 | Fiebag et al. | | 430/331 |
| 7,858,292 B2 * | 12/2010 | Baumann et al. | | 430/302 |
| 2004/0033255 A1 * | 2/2004 | Baker et al. | | 424/449 |
| 2005/0214677 A1 * | 9/2005 | Nagashima | | 430/270.1 |
| 2005/0287481 A1 * | 12/2005 | Kurokawa et al. | | 430/331 |
| 2008/0044758 A1 * | 2/2008 | Tao et al. | | 430/270.1 |
| 2008/0113298 A1 * | 5/2008 | Baumann et al. | | 430/302 |
| 2008/0199804 A1 | 8/2008 | Oohashi | | |
| 2008/0274429 A1 * | 11/2008 | Teng | | 430/303 |
| 2009/0233216 A1 * | 9/2009 | Teshima | | 430/115 |

FOREIGN PATENT DOCUMENTS
WO    WO 2008113582 A1 *   9/2008

* cited by examiner

*Primary Examiner* — Cynthia H Kelly
*Assistant Examiner* — Chanceity Robinson
(74) *Attorney, Agent, or Firm* — J. Lanny Tucker

(57) ABSTRACT

Lithographic printing plates can be obtained by contacting infrared radiation-imaged negative-working lithographic printing plate precursors with a processing solution having a pH less than 9 and comprising a UV photoinitiator. After this processing, the lithographic printing plate is floodwise exposed with UV radiation. Providing a UV-photoinitiator in the processing solution followed by UV exposure can increase imaging sensitivity and printing plate run-length, and reduce print background.

21 Claims, No Drawings

METHOD OF PROVIDING LITHOGRAPHIC PRINTING PLATES

FIELD OF THE INVENTION

This invention relates to a method of processing imaged negative-working imageable elements such as negative-working lithographic printing plate precursors using a relatively low pH processing solution containing an UV photoinitiator. This processing can occur either on-press or off-press.

BACKGROUND OF THE INVENTION

Radiation-sensitive compositions are routinely used in the preparation of imageable materials including lithographic printing plate precursors. Such compositions generally include a radiation-sensitive component, an initiator system, and a binder, each of which has been the focus of research to provide various improvements in physical properties, imaging performance, and image characteristics. Such compositions are generally provided as imageable layers.

Recent developments in the field of printing plate precursors concern the use of radiation-sensitive compositions that can be imaged by means of lasers or laser diodes. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

A large variety of offset lithographic printing plates comprise a grained anodized aluminum-containing substrate that is coated with a radiation sensitive layer. The radiation is used to either solubilize background areas, leaving relatively soluble image areas, or to insolubilize image areas leaving soluble background areas. The soluble background areas may be removed using a processing liquid (developer) that is generally water-based having a pH of 12 or more. The resulting plates then may be washed with water and treated with a gum solution either for storage or immediate printing. Digital printing plates that are imaged using a laser (either infrared or violet) are mainly developed in a manner similar to non-digital (i.e. analog plates).

The difference in solubility of the background and the image within the developer should be as large as possible so that development is tolerant of varying conditions. However tolerant it may be, there are generally possibilities of under-development when not all of the background coating has been removed and this may cause background scumming during printing, and over-development when fine image areas may disappear. Indeed, for many types of imaged plates, if they are left in the developer indefinitely, the entire image will disappear. Development can be halted when the printing plate is washed so that its surface has a neutral environment and it is further stabilized on the printing machine where the fountain solution is invariably acidic, usually with a pH of from 4 to 6.

In order to optimize the time taken to prepare offset lithographic plates, it is necessary to minimize the time for imaging exposure. Where the process is one of cross-linking or polymerization of the material using for instance a laser beam, the time can be minimized by using just enough energy to permit the background to be dissolved by the processing solution. However, in choosing to minimize imaging time the extent of cross-linking/polymerization may be limited and thus incomplete. If this is the case, then the run length of the plate may be curtailed by image erosion. Thus there can be a conflict among imaging speed, processing conditions, and plate run length. This problem may be minimized by treating the imaged printing plate with heating before processing, or even by heating the printing plate precursor prior to imaging to improve plate sensitivity. However, the use of a heating step requires extra time and energy and is a disadvantage.

Most negative-working imageable elements are processed using high pH processing solutions that may deteriorate both from use, as the solution of plate material gradually lowers the pH, and from the absorption of carbon dioxide from the air which has a similar effect. This problem is ameliorated by providing a replenishing liquid that is introduced into the processor to maintain the potency of the developer. High pH liquid developers cannot be disposed of down the drain where prohibited by law.

Recently, the industry has produced printing plates that can be developed on-press either by means of the fountain solution or the lithographic ink, or by a combination of both. This has certain advantages. The customer dispenses with all of the problems mentioned above relating to the developer as well a gaining from being able to operate without a large processor unit. However, because development is done during printing conditions, development tends to continue so long as there is something to develop. In order to avoid this as much as possible the plates developed have been negative-working. Even if the image is gradually developed away during a long print run by using a polymerized image, optimal run length has been achieved. However although images may be obtained at a lower laser exposure, such images can be easily worn away. Thus it is beneficial to work at relatively high laser exposures in order to achieve optimum print run. This means that in practice, lithographic printing plates developed on-press plates are not of the highest sensitivity.

A further problem in the design of on-press developed printing plates is that the non-imaged material that is removed from the printing plate must not be so colored or the color will find its way into the ink and contaminate the image. This may be especially evident in the yellow ink. The corollary of this is that the image/background on imaged printing plate before it is placed on the printing press has minimal coloration contrast. It could be unreadable or may not be used to calibrate the CTP (computer to plate) imaging system to be certain of working at maximum setting.

Despite all of these problems, customers still find the advantages of on-press processing to be attractive.

A second approach to coping with the problems of separate development is to try to simplify the processing so that the processor is more compact and the processing liquid is stable and can be disposed of in the sewerage. It is advantageous in these respects if the developer is neutral or acidic, but if this is the case then there is a danger that the plate will continue to develop in the presence of the acidic fountain solution on the press.

US 2008/0199804 (Oohashi) describes some of the problems of simple and on-press processing that are described above. This publication describes printing plate precursor formulations containing radical polymerizable compositions having high sensitivity and being capable of development at pH of 10 or less on a printing press. After development, the plate may be floodwise exposed using various types of radiation. But as described in the publication, if the radiation is such that it would be affected by surrounding light under a working environment, it is preferable that the plate-making line is blinded by a cover. It is unclear from this publication as to the pH of the aqueous developer (the preferred development is from 11.5 to 12.5). Thus Oohashi fails to appreciate the advantages of acid processing and fails to produce printing plates that could overcome the disadvantages of using high pH development.

We have discovered a need to provide low pH processing while maintaining high sensitivity and long run length in lithographic printing plates obtained from negative-working imageable elements.

SUMMARY OF THE INVENTION

The present invention provides a method of providing a lithographic printing plate comprising:

A. contacting an infrared radiation-imaged negative-working lithographic printing plate precursor with a processing solution having a pH less than 9 and comprising a UV photoinitiator, to provide a lithographic printing plate, and B. floodwise exposing the lithographic printing plate with UV radiation.

In some embodiments, a method of providing a lithographic printing plate comprises:

A. imagewise exposing a negative-working lithographic printing plate precursor to infrared radiation to provide exposed and non-exposed regions, B. contacting the exposed lithographic printing plate precursor with a processing solution having a pH less than 9 and comprising a UV photoinitiator, to provide a lithographic printing plate, and C. floodwise exposing the lithographic printing plate with UV radiation.

In some embodiments, step A or step B, or both steps A and B, are carried out on-press.

We have found that an improvement in processing can be achieved by exposing the processed printing plate with UV radiation to further harden the imaged areas, and making it possible to avoid heating between imaging and processing if desired. Thus, processing can be achieved preferably with relatively low pH processing solutions without a sacrifice in imaging sensitivity and printing plate run length. Excessive development from use of acidic or neutral solutions can be avoided. The post-UV exposure is possible because a UV photoinitiator is incorporated into the processing solution and this UV photoinitiator is absorbed into the imaged areas to provide UV sensitivity. The processing solution is generally designed for off-press processing, but on-press development can also be used if a fountain solution is its basic solvent. In addition, the present invention provides lithographic printing plates that have improved resistance to a variety of lithographic printing inks and fountain solutions.

For example, the printing plate sensitivity may be significantly increased (for instance reducing required imaging exposure from about 320 mJ/cm$^2$ to about 250 mJ/cm$^2$). If the printing plate is not treated with UV according to this invention, then although an imaging energy of 250 mJ/cm$^2$ is used, a good image may originally be seen on the plate in the first 200 or so impressions or prints, but the print quality rapidly deteriorates making it necessary to use higher imaging energy. Without UV exposure according to this invention, 320 mJ/cm$^2$ exposure may give an image with a run length of around 100,000 impressions. Using a UV photoinitiator in the processing solution and UV floodwise exposure according to this invention, more than 100,000 impressions can be obtained with imaging exposure for instance at 250 mJ/cm$^2$.

It has been found that attention should be paid to adjust the combination of dip processing time and UV exposure when the photoinitiator is present in the processing solution in order to obtain a clean print background during printing. Too much exposure causes objectionable print background. While not being bound to any mechanism, it is thought that this is caused by residual unexposed coating being trapped in the grain surface of the anodized grained aluminum substrate, which residual coating is then polymerized during UV exposure. As the processing speed determines both dip processing time and UV exposure, shorted dip processing times will provide shorter UV exposure. This means that a compromise must be made in order to have sufficient dip processing time for desired development but not too much exposure to obtain acceptable print background. It is also important to use desired UV exposure to optimize the noted benefits of improved sensitivity and run length.

We found that this problem can be overcome in a surprising manner by addition to the processing solution of a water-soluble yellow dye with strong absorption properties in the UV exposure region. Examples of useful yellow dyes having these characteristics are described below. With the addition of these dyes, it is possible to increase UV exposure without causing undesirable print background.

DETAILED DESCRIPTION OF THE INVENTION

The method of this invention can be used to provide lithographic printing plates using negative-working printing plate precursors and the processing solution and steps described below.

In addition, unless the context indicates otherwise, the various components used in the printing plate precursors and processing solutions described herein such as "polymeric binder", "free radically polymerizable component", "infrared radiation absorbing compound", UV photoinitiator, hydrophilic solvent, hydrophilic polymer, biocide, surfactant, and similar terms also refer to a plurality of such components. Thus, the use of the articles "a", "an", and "the" is not necessarily meant to refer to only a single component.

Moreover, unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

Lithographic Printing Plate Precursors

The lithographic printing plate precursors used in this invention include an infrared (IR) radiation-sensitive composition disposed on a suitable substrate to form an imageable layer.

The IR radiation-sensitive composition (and imageable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used.

Suitable ethylenically unsaturated components that can be polymerized or crosslinked include ethylenically unsaturated polymerizable monomers that have one or more of the polymerizable groups, including unsaturated esters of alcohols, such as acrylate and methacrylate esters of polyols. Oligomers or prepolymers, such as urethane acrylates and methacrylates, epoxide acrylates and methacrylates, polyester acrylates and methacrylates, polyether acrylates and methacrylates, and unsaturated polyester resins can also be used.

Useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers. Free radically polymerizable compounds include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20) trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. Nos. 6,309,792 (Hauck et al.), 6,569,603 (Furukawa), and 6,893,797 (Munnelly et al.).

Other useful free radically polymerizable components include those described in copending and commonly assigned U.S. Ser. No. 11/949,810 (filed Dec. 4, 2007 by Bauman, Dwars, Strehmel, Simpson, Savariar-Hauck, and Hauck) that include 1H-tetrazole groups. This copending application is incorporated herein by reference.

In addition to, or in place of the free radically polymerizable components described above, the IR radiation-sensitive composition may include polymeric materials that include side chains attached to the backbone, which side chains include one or more free radically polymerizable groups (such as ethylenically unsaturated groups) that can be polymerized (crosslinked) in response to free radicals produced by the initiator composition (described below). There may be at least two of these side chains per molecule. The free radically polymerizable groups (or ethylenically unsaturated groups) can be part of aliphatic or aromatic acrylate side chains attached to the polymeric backbone. Generally, there are at least 2 and up to 20 such groups per molecule, or typically from 2 to 10 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

Useful commercial products that comprise polymers that can be used in this manner include Bayhydrol® UV VP LS 2280, Bayhydrol® UV VP LS 2282, Bayhydrol® UV VP LS 2317, Bayhydrol® UV VP LS 2348, and Bayhydrol® UV XP 2420, that are all available from Bayer MaterialScience, as well as Laromer™ LR 8949, Laromer™ LR 8983, and Laromer™ LR 9005, that are all available from BASF.

The one or more free radically polymerizable components (monomeric, oligomeric, or polymeric) can be present in the imageable layer in an amount of at least 10 weight % and up to 80 weight %, and typically from about 20 to about 50 weight %, based on the total dry weight of the imageable layer. The weight ratio of the free radically polymerizable component to the total polymeric binders (described below) is generally from about 5:95 to about 95:5, and typically from about 10:90 to about 90:10, or even from about 30:70 to about 70:30.

The IR radiation-sensitive composition also includes an initiator composition that includes one or more initiators that are capable of generating free radicals sufficient to initiate polymerization of all the various free radically polymerizable components upon exposure of the composition to imaging radiation. The initiator composition is generally responsive to infrared imaging radiation corresponding to the spectral range of at least 700 nm and up to and including 1400 nm (typically from about 750 to about 1250 nm). Initiator compositions are used that are appropriate for the desired imaging wavelength(s).

Useful iodonium cations are well known in the art including but not limited to, U.S. Patent Application Publication 2002/0068241 (Oohashi et al.), WO 2004/101280 (Munnelly et al.), and U.S. Pat. Nos. 5,086,086 (Brown-Wensley et al.), 5,965,319 (Kobayashi), and 6,051,366 (Baumann et al.). For example, a useful iodonium cation includes a positively charged iodonium, (4-methylphenyl)[4-(2-methylpropyl) phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl) phenyl]iodonium hexafluorophosphate and is supplied in a 75% propylene carbonate solution.

The iodonium cations can be paired with a suitable number of negatively-charged counterions such as halides, hexafluorophosphate, thiosulfate, hexafluoroantimonate, tetrafluoroborate, sulfonates, hydroxide, perchlorate, and others readily apparent to one skilled in the art.

Thus, the iodonium cations can be supplied as part of one or more iodonium salts, and as described below, the iodonium cations can be supplied as iodonium borates also containing suitable boron-containing anions. For example, the iodonium cations and the boron-containing anions can be supplied as part of salts that are combinations of Structures (IB) and (IBz) described below, or both the iodonium cations and boron-containing anions can be supplied from different sources. However, if they are supplied at least from the iodonium borate salts, since such salts generally supply about a 1:1 molar ratio of iodonium cations to boron-containing anions, additional iodonium cations must be supplied from other sources, for example, from iodonium salts described above.

For example, the imageable layer (and element) can comprise a mixture of iodonium cations, some of which are derived from an iodonium borate (described below) and others of which are derived from a non-boron-containing iodonium salt (described above). When both types of iodonium salts are present, the molar ratio of iodonium derived from the iodonium borate to the iodonium derived from the non-boron-containing iodonium salt can be up to 5:1 and typically up to 2.5:1.

One class of useful iodonium cations include diaryliodonium cations that are represented by the following Structure (IB):

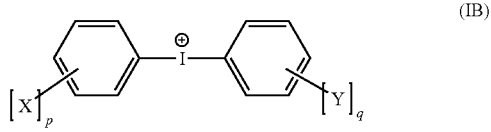

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, isopropoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Typically, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated but the "symmetric" compounds are preferred (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but typically they are at the 2- or 4-positions on either or both phenyl rings.

Despite what type of X and Y groups are present in the iodonium cation, the sum of the carbon atoms in the X and Y substituents generally is at least 6, and typically at least 8, and up to 40 carbon atoms. Thus, in some compounds, one or more X groups can comprise at least 6 carbon atoms, and Y does not exist (q is 0). Alternatively, one or more Y groups can comprise at least 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is at least 6. Still again, there may be a total of at least 6 carbon atoms on both phenyl rings.

In Structure IB, p and q are independently 0 or integers of 1 to 5. Typically, both p and q are at least 1, or each of p and q is 1. Thus, it is understood that the carbon atoms in the phenyl rings that are not substituted by X or Y groups have a hydrogen atom at those ring positions.

Useful boron-containing anions are organic anions having four organic groups attached to the boron atom. Such organic anions can be aliphatic, aromatic, heterocyclic, or a combination of any of these. Generally, the organic groups are substituted or unsubstituted aliphatic or carbocyclic aromatic groups. For example, useful boron-containing anions can be represented by the following Structure (IBz):

wherein $R_1$, $R_2$, $R_3$, and $R_4$ are independently substituted or unsubstituted alkyl groups having 1 to 12 carbon atoms (such as methyl, ethyl, n-propyl, isopropyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazolyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms. None of the $R_1$ through $R_4$ groups contains halogen atoms and particularly fluorine atoms.

Typically, $R_1$, $R_2$, $R_3$, and $R_4$ are independently substituted or unsubstituted alkyl or aryl groups as defined above, and more typically, at least 3 of $R_1$, $R_2$, $R_3$, and $R_4$ are the same or different substituted or unsubstituted aryl groups (such as substituted or unsubstituted phenyl groups). For example, all of $R_1$, $R_2$, $R_3$, and $R_4$ can be the same or different substituted or unsubstituted aryl groups, or all of the groups are the same substituted or unsubstituted phenyl group. $Z^-$ can be a tetraphenyl borate wherein the phenyl groups are substituted or unsubstituted (for example, all are unsubstituted phenyl groups).

Some representative iodonium borate compounds include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-4'-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis(penta-fluorophenyl)borate, 4-methylphenyl-4'-dodecylphenyliodonium tetrakis(4-fluorophenyl)borate, bis(dodecylphenyl)iodonium tetrakis(pentafluorophenyl)-borate, and bis(4-t-butylphenyl)iodonium tetrakis(1-imidazolyl)borate. Mixtures of two or more of these compounds can also be used in the iodonium borate initiator composition.

The boron-containing anions can also be supplied as part of infrared radiation absorbing dyes (for example, cationic dyes).

The iodonium cations and boron-containing anions are generally present in the imageable layer in a combined amount of at least 1% and up to and including 15%, and typically at least 4 and up to and including 10%, based on total dry weight of the imageable layer. The optimum amount of the various initiator components may differ for various compounds and the sensitivity of the radiation-sensitive composition that is desired and would be readily apparent to one skilled in the art.

The imageable layer may also include heterocyclic mercapto compounds including mercaptotriazoles, mercaptobenzimidazoles, mercaptobenzoxazoles, mercaptobenzothiazoles, mercaptobenzoxadiazoles, mercaptotetrazoles.

The IR radiation-sensitive composition sensitivity is provided by the presence of one or more infrared radiation absorbing compounds, chromophores, or sensitizers that absorb imaging radiation, or sensitize the composition to imaging infrared radiation having a $\lambda_{max}$ of from about 700 nm and up to and including 1400 nm, and typically from about 700 to about 1200 nm.

Useful IR radiation absorbing chromophores include various IR-sensitive dyes ("IR dyes"). Examples of suitable IR dyes comprising the desired chromophore include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. Nos. 5,208,135 (Patel et al.), 6,153,356 (Urano et al.), 6,264,920 (Achilefu et al.), 6,309,792 (Hauck et al.), 6,569,603 (noted above), 6,787,281 (Tao et al.), 7,135,271 (Kawaushi et al.), and EP 1,182,033A2 (noted above). Infrared radiation absorbing N-alkylsulfate cyanine dyes are described for example in U.S. Pat. No. 7,018,775 (Tao). A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. Nos. 6,309,792 (noted above), 6,264,920 (Achilefu et al.), 6,153,356 (noted above), 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Useful infrared radiation absorbing dyes can be obtained from a number of commercial sources including Showa Denko (Japan) or they can be prepared using known starting materials and procedures.

Still other useful infrared radiation absorbing compounds are copolymers can comprise covalently attached ammonium, sulfonium, phosphonium, or iodonium cations and infrared radiation absorbing cyanine anions that have two or four sulfonate or sulfate groups, or infrared radiation absorbing oxonol anions, as described for example in U.S. Pat. No. 7,049,046 (Tao et al.).

The infrared radiation absorbing compounds can be present in the IR-radiation sensitive composition (or imageable layer) in an amount generally of at least 1% and up to and including 30% and typically at least 3 and up to and including 20%, based on total solids in the composition, that also corresponds to the total dry weight of the imageable layer. The particular amount needed for this purpose would be readily apparent to one skilled in the art, depending upon the specific compound used to provide the desired chromophore.

The imageable layer includes a one or more polymeric binders in an amount of from about 10 to about 90 weight %, or typically from about 30 to about 70 weight %, based on the total imageable layer dry weight.

Some useful polymeric binders are present as discrete particles having an average particle size of from about 10 to about 500 nm, and typically from about 150 to about 450 nm, and are generally distributed uniformly within that layer. The particulate polymeric binders exist at room temperature as discrete particles, for example in an aqueous dispersion. However, the particles can also be partially coalesced or deformed, for example at temperatures used for drying coated imageable layer formulations. Even in this environment, the particulate structure is not destroyed. Such polymeric binders generally have a molecular weight ($M_n$) of at least 30,000 and typically at least 50,000 to about 100,000, or from about 60,000 to about 80,000, as determined by refractive index.

Other useful polymeric binders include polymeric emulsions or dispersions of polymers having hydrophobic backbones to which are attached pendant poly(alkylene oxide) side chains, cyano side chains, or both, that are described for example in U.S. Pat. Nos. 6,582,882 (Pappas et al.), 6,899,994 (Huang et al.), 7,005,234 (Hoshi et al.), and 7,368,215 (Munnelly et al.) and US Patent Application Publication 2005/0003285 (Hayashi et al.) that are all incorporated herein by reference. More specifically, such polymeric binders include but are not limited to, graft copolymers having both hydrophobic and hydrophilic segments, block and graft copolymers having polyethylene oxide (PEO) segments, polymers having both pendant poly(alkylene oxide) segments and cyano groups, and various hydrophilic polymeric binders that may have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art. Such polymeric binders are particularly useful for lithographic printing plate precursors that are processable on-press.

Alternatively, the polymeric binders can also be particulate polymers that have a backbone comprising multiple (at least two) urethane moieties. Such polymeric binders generally have a molecular weight ($M_n$) of at least 2,000 and typically at least 100,000 to about 500,000, or from about 100,000 to about 300,000, as determined by dynamic light scattering.

Additional useful first polymeric binders are particulate poly(urethane-acrylic) hybrids that are distributed (usually uniformly) throughout the imageable layer. Each of these hybrids has a molecular weight of from about 50,000 to about 500,000 and the particles have an average particle size of from about 10 to about 10,000 nm (for example from about 30 to about 500 nm or from about 30 to about 150 nm). These hybrids can be either "aromatic" or "aliphatic" in nature depending upon the specific reactants used in their manufacture. Blends of particles of two or more poly(urethane-acrylic) hybrids can also be used. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that may also include commercial surfactants, anti-foaming agents, dispersing agents, anti-corrosive agents, and optionally pigments and water-miscible organic solvents.

Other useful polymeric binders may be homogenous, that is, non-particulate or dissolved in the coating solvent, or they may exist as discrete particles. Such polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033A1 (Fujimaki et al.) and U.S. Pat. Nos. 6,309,792 (Hauck et al.), 6,352,812 (Shimazu et al.), 6,569,603 (Furukawa et al.), and 6,893,797 (Munnelly et al.). Also useful are the vinyl carbazole polymers described in U.S. Pat. No. 7,175,949 (Tao et al.), and the polymers having pendant vinyl groups as described in U.S. Pat. No. 7,279,255 (Tao et al.). Copolymers of polyethylene glycol methacrylate/acrylonitrile/styrene in particulate form, dissolved copolymers derived from carboxyphenyl methacrylamide/acrylonitrile/methacrylamide/N-phenyl maleimide, copolymers derived from polyethylene glycol methacrylate/acrylonitrile/vinyl carbazole/styrene/methacrylic acid, copolymers derived from N-phenyl maleimide/methacrylamide/methacrylic acid, copolymers derived from urethane-acrylic intermediate A (the reaction product of p-toluene sulfonyl isocyanate and hydroxyl ethyl methacrylate)/acrylonitrile/N-phenyl maleimide, and copolymers derived from N-methoxymethyl methacrylamide/methacrylic acid/acrylonitrile/n-phenylmaleimide are useful.

Still other useful polymeric binders having recurring units comprising pendant —C(=O)O—CH$_2$CH=CH$_2$ groups or have pendant allyl ester groups as described in U.S. Pat. No. 7,332,253 (Tao et al.) that is incorporated herein by reference.

Other useful recurring units can be derived from one or more of vinyl carbazole or vinyl carbazole derivatives as described in U.S. Pat. No. 7,175,949 (Tao et al.), alkyl (meth) acrylates [such as methyl (meth)acrylates], (meth)acrylamides, N-phenyl maleimides, poly(alkylene glycol) methyl ether (meth)acrylates [such as poly(ethylene glycol) methyl ether (meth)acrylates], and styrene monomers such as substituted and unsubstituted styrene.

The imageable layers in the lithographic printing plate precursor can further comprise a compound that is capable of being polymerized by the UV photoinitiator that is included in the processing solution (described below). Such compounds include but are not limited to, oligomers of urethane di- or tri-(meth)acrylates having multiple polymerizable groups, or polyester or polyether (meth)acrylates with two or more acrylate groups. These compounds can be present in the imageable layers in an amount of from about 10 to about 90 weight % or from about 30 to about 70 weight %, based on imageable layer solids.

The imageable layer can also include a spirolactone or spirolactam colorant precursor. Such compounds are generally colorless or weakly colored until the presence of an acid causes the ring to open providing a colored species, or more intensely colored species.

Examples of useful colorant precursors include but are not limited to, Crystal Violet Lactone, Malachite Green Lactone, 3-(N,N-diethylamino)-6-chloro-7-(β-ethoxyethylamino) fluoran, 3-(N,N,N-triethylamino)-6-methyl-7-anilinofluoran, 3-(N,N-diethylamino)-7-chloro-7-o-chlorofluoran, 2-(N-phenyl-N-methylamino)-6-(N-p-tolyl-N-ethyl)aminofluoran, 2-anilino-3-methyl-6-(N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-chlorofluoran, 3-(N,N-diethylamino)-7-(4-chloroanilino)fluoran, 3-(N,N-diethylamio)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis((1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-azaphthalide, and 3-(4-diethylaminophenyl)-3-(1-ethyl-2-methylindol-3-yl) phthalide.

The colorant precursor described above can be present in an amount of at least 1 and up to 10 weight %, and typically from about 3 to about 6 weight %, based on the total dry imageable layer weight.

The radiation-sensitive composition (imageable layer) can further comprise one or more phosphate (meth)acrylates, each of which has a molecular weight generally greater than 200 and typically at least 300 and up to and including 1000. By "phosphate (meth)acrylate" we also mean to include "phosphate methacrylates" and other derivatives having substituents on the vinyl group in the acrylate moiety. Such compounds and their use in imageable layers are described in more detail in U.S. Pat. No. 7,175,969 (Ray et al.) that is incorporated herein by reference. The phosphate (meth)acrylate can be present in the radiation-sensitive composition in an amount of at least 0.5 and up to and including 20% and typically at least 0.9 and up to and including 10%, based on total dry composition weight.

The imageable layer can also include a poly(alkylene glycol) or an ether or ester thereof that has a molecular weight of at least 200 and up to and including 4000. This additive can be present in an amount of at least 2 and up to and including 50 weight %, based on the total dry weight of the imageable layer and include one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are Sartomer SR9036 (ethoxylated (30) bisphenol A dimethacrylate), CD9038 (ethoxylated (30) bisphenol A diacrylate), SR399 (dipentaerythritol pentaacrylate), and Sartomer SR494 (ethoxylated (5) pentaerythritol tetraacrylate), and similar compounds all of which that can be obtained from Sartomer Company, Inc.

The imageable layer can also include a poly(vinyl alcohol), a poly(vinyl pyrrolidone), poly(vinyl imidazole), or polyester in an amount of up to and including 20 weight % based on the total dry weight of the imageable layer.

Additional additives to the imageable layer include color developers or acidic compounds. As color developers, we mean to include monomeric phenolic compounds, organic acids or metal salts thereof, oxybenzoic acid esters, acid clays, and other compounds described for example in U.S. Patent Application Publication 2005/0170282 (Inno et al.). Specific examples of phenolic compounds include but are not limited to, 2,4-dihydroxybenzophenone, 4,4'-isopropylidene-diephenol (Bisphenol A), p-t-butylphenol, 2,4,dinitrophenol, 3,4-dichlorophenol, 4,4'-methylene-bis(2,6'-di-t-butylphenol), p-phenylphenol, 1,1-bis(4-hydroxyphenyl)cyclohexane, 1,1-bis(4-hydroxyphenyl)-2-ethylhexene, 2,2-bis(4-hydroxyphenyl)butane, 2,2'-methylenebis(4-t-butylphenol), 2,2'-methylenebis(α-phenyl-p-cresol) thiodiphenol, 4,4'-thiobis(6-t-butyl-m-cresol) sulfonyldiphenol, p-butylphenol-formalin condensate, and p-phenylphenol-formalin condensate. Examples of useful organic acids or salts thereof include but are not limited to, phthalic acid, phthalic anhydride, maleic acid, benzoic acid, gallic acid, o-toluic acid, p-toluic acid, salicylic, 3-t-butylsalicylic, 3,5-di-3-t-butylsalicylic acid, 5-α-methylbenzylsalicylic acid, 3,5-bis(α-methylbenzyl)salicylic acid, 3-t-octylsalicylic acid, and their zinc, lead, aluminum, magnesium, and nickel salts. Examples of the oxybenzoic acid esters include but are not limited to, ethyl p-oxybenzoate, butyl p-oxybenzoate, heptyl p-oxybenzoate, and benzyl p-oxybenzoate. Such color developers may be present in an amount of from about 0.5 to about 5 weight %, based on total imageable layer dry weight.

The imageable layer can also include a variety of dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

The lithographic printing plate precursors can be formed by suitable application of a radiation-sensitive composition as described above to a suitable substrate to form an imageable layer. This substrate can be treated or coated in various ways as described below prior to application of the radiation-sensitive composition to improve hydrophilicity. Typically, there is only a single imageable layer comprising the radiation-sensitive composition.

The substrate generally has a hydrophilic surface, or at least a surface that is more hydrophilic than the applied radiation-sensitive composition on the imaging side. The substrate comprises a support that can be composed of any material that is conventionally used to prepare lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful substrate is an electrochemically grained and sulfuric acid anodized aluminum support that provides a hydrophilic surface.

An interlayer may be formed by treatment of the aluminum support with, for example, a silicate, dextrine, calcium zirconium fluoride, hexafluorosilicic acid, poly(vinyl phosphonic acid) (PVPA), vinyl phosphonic acid copolymer, poly[(meth)acrylic acid], poly(acrylic acid), or an acrylic acid copolymer to increase hydrophilicity. Still further, the aluminum support may be treated with a phosphate solution that may further contain an inorganic fluoride (PF). The aluminum support can be electrochemically-grained, phosphoric acid-anodized, and treated with poly(acrylic acid) using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate may be coated with antistatic agents and/or slipping layers or a matte layer to improve handling.

The substrate can also be a cylindrical surface having the radiation-sensitive composition applied thereon, and thus be an integral part of the printing press. The use of such imaging cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Typically, the radiation-sensitive composition is applied and dried to form an imageable layer and an overcoat formulation can be applied to that layer.

Illustrative of such manufacturing methods is mixing the desired components of the radiation-sensitive composition in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions.

Layers can also be present under the imageable layer to enhance developability or to act as a thermal insulating layer. The underlying layer should be soluble or at least dispersible in the developer and typically have a relatively low thermal conductivity coefficient.

Intermediate drying steps may be used between applications of the various layer formulations to remove solvent(s) before coating other formulations. Drying steps at conventional times and temperatures may also help in preventing the mixing of the various layers.

Once the various layers have been applied and dried on the substrate, the lithographic printing plate precursor can be enclosed in water-impermeable material that substantially inhibits the transfer of moisture to and from the precursor as described in U.S. Pat. No. 7,175,969 (noted above).

If desired, the lithographic printing plate precursor can include what is conventionally known as an overcoat or topcoat layer (such as an oxygen impermeable topcoat) applied to and disposed over the imageable layer for example, as described in WO 99/06890 (Pappas et al.). Such topcoat layers can comprise one or more water-soluble polymer binders chosen from such polymers as poly(vinyl alcohol)$_s$, poly (vinyl pyrrolidone), poly(ethyleneimine), poly(vinyl imidazole), and copolymers of two or more of vinyl pyrrolidone, ethyleneimine, and vinyl imidazole, and generally have a dry coating weight of at least 0.1 and up to and including 2 g/m$^2$ (typically from about 0.1 to about 0.5 g/m$^2$) in which the water-soluble polymer(s) comprise at least 50% and up to 98% of the dry weight of the topcoat layer. Topcoat layer polymer binders are also described in U.S. Pat. Nos. 3,458,311 (Alles), 4,072,527 (Fanni), and 4,072,528 (Bratt), and EP Publications 275,147A2 (Wade et al.), 403,096A2 (Ali), 354, 475A2 (Zertani et al.), 465,034A2 (Ueda et al.), and 352,630A2 (Zertani et al.).

The topcoat layer can also include a composition that is capable of changing color upon exposure to imaging infrared radiation. This composition can comprise various component formulations. In one embodiment, it comprises: (1) an infrared absorbing compound, (2) a compound that, in the presence of this IR absorbing compound generates an acid in response to the imaging infrared radiation, and optionally (3) one or more compounds that provide a color change in the presence of an acid. In some embodiments, components (1) and (3) are the same, while in other embodiments, they are different. In the latter embodiments, component (3) can be a spirolactone or spirolactam colorant precursor. Such compounds are generally colorless or weakly colored until the presence of an acid causes the ring to open providing a colored species, or more intensely colored species.

Additional additives to the topcoat layer can include color developers or acidic compounds. As color developers, we mean to include monomeric phenolic compounds, organic acids or metal salts thereof, oxybenzoic acid esters, acid clays, and other compounds described for example in U.S. Patent Application Publication 2005/0170282 (Inno et al.).

Imaging Conditions

The lithographic printing plate precursor can be exposed to a suitable source of imaging or exposing near-infrared or infrared radiation, depending upon the radiation absorbing compound present in the radiation-sensitive composition, at a wavelength of from about 700 to about 1500 nm. For example, imaging can be carried out using imaging or exposing radiation, such as from an infrared laser (or array of lasers) at a wavelength of at least 700 nm and up to and including about 1400 nm and typically at least 750 nm and up to and including 1250 nm. Imaging can be carried out using imaging radiation at multiple wavelengths at the same time if desired.

The laser used to expose the precursor is usually a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. Examples of useful imaging apparatus are available as models of Creo Trendsetter® platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image a precursor while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/cm$^2$ and up to and including 500 mJ/cm², and typically at least 50 and less than 300 mJ/cm² depending upon the sensitivity of the imageable layer.

In some embodiments, the advantage of this invention is that imagewise exposing is carried out using exposure energy of less than 300 mJ/cm².

For example, in some embodiments, the lithographic printing plate precursor contains an IR-sensitive dye and the imagewise exposing step A is carried out using radiation having a maximum wavelength of from about 700 to about 1200 nm at an energy level of from about 20 to about 500 mJ/cm².

While laser imaging is desired in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

With or without a post-exposure baking (or heating) step after imaging and before development (between Steps A and B), the imaged precursors can be developed either "off-press" as described in more detail below. In some embodiments, a post-exposure baking step is omitted, whereas in other embodiments, the imaged precursor is heated.

After thermal imaging, the elements are processed "off-press" using an alkaline processing solution described herein. Processing is carried out for a time sufficient to remove predominantly only the non-exposed regions of the outermost imaged imageable layer to reveal the hydrophilic surface of the substrate, but not long enough to remove significant amounts of the exposed regions. The revealed hydrophilic surface repels inks while the exposed regions accept ink. Thus, the non-exposed regions to be removed are "soluble" or "removable" in the processing solution because they are removed, dissolved, or dispersed within it more readily than the regions that are to remain. The term "soluble" also means "dispersible".

Thus, without the need for a pre-heat step after imaging, the imaged elements can be developed using what is known as "manual" development, "dip" development, or processing with an automatic development apparatus (processor).

In the case of "manual" development, development is conducted by rubbing the entire imaged element with a sponge or cotton pad sufficiently impregnated with a suitable developer (described below), and followed by rinsing with water. "Dip" development involves dipping the imaged element in a tank or tray containing the appropriate developer for about 10 to about 60 seconds (especially from about 20 to about 40 seconds) under agitation, followed by rinsing with water with or without rubbing with a sponge or cotton pad. The use of automatic development apparatus is well known and generally includes pumping a developer into a developing tank or ejecting it from spray nozzles. The imaged element is contacted with the developer in an appropriate manner. The apparatus (processing unit or station) may also include a suitable rubbing mechanism (for example a brush or roller) and a suitable number of conveyance rollers. Some developing apparatus include laser exposure means and the apparatus is divided into an imaging section and a developing section.

For example, the processing solution (or developer) can be applied to the imaged element by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the outer layer with the processing solution or contacting it with a roller, impregnated pad, or applicator containing the gum. For example, the imaged element can be brushed with the processing solution, or it can be poured onto or applied by spraying the imaged surface with sufficient force to remove the non-exposed regions using a spray nozzle system as described for example in [0124] of EP 1,788,431A2 (noted above) and U.S. Pat. No. 6,992,688 (Shimazu et al.).

Residual processing solution may be removed (for example, using a squeegee or nip rollers) or left on the resulting printing plate without any rinsing step. Excess processing solution can be collected in a tank and used several times, and replenished if necessary from a reservoir. The processing solution replenisher can be of the same concentration as that used in processing, or be provided in concentrated form and diluted with water at an appropriate time.

Developers or processing solutions commonly include water, surfactants, biocides, hydrophilic compounds, chelating agents (such as salts of ethylenediaminetetraacetic acid), water-soluble or water-miscible organic solvents (such as benzyl alcohol), 2-butoxy ethanol, and 2-butoxy propanol. The pH of the developer is generally from about 4 to about 7, and typically from about 4 to about 6 and can be controlled using mild acids or acidic solutions such as alcohol substitute fountain solutions. The imaged elements are generally developed using conventional processing conditions.

In some instances, a single processing solution is used to both develop the imaged element by removing predominantly the non-exposed regions and also to provide a protective layer or coating over the entire imaged and developed surface. In this aspect, the processing solution can behave somewhat like a gum that is capable of protecting the lithographic image on the printing plate against contamination or damage (for example, from oxidation, fingerprints, dust, or scratches). They generally include one or more anionic surfactants, even though optional components (such as nonionic surfactants) can be present if desired. Useful anionic surfactants include those with carboxylic acid, sulfonic acid, or phosphonic acid groups (or salts thereof). Anionic surfactants having sulfonic acid (or salts thereof) groups are particularly useful. For example, such anionic surfactants can include aliphates, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxy-ethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylester, salts of alkylsulfuric esters, sulfuric esters of polyoxy-ethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary anionic surfactant. Such surfactants can be obtained from various suppliers as described in McCutcheon's Emulsifiers & Detergents, 2007 Edition.

The aqueous processing solution described above also includes one or more UV photoinitiators that have sensitivity at a $\lambda_{max}$ of from about 300 to about 450 nm. Classes of useful compounds include but are not limited to, benzophenones, ketones, acetophenones, acylphosphine oxides, alkylaryl ketones, benzoin derivatives, methylobenzoin and 4-benzoyl-1,3-dioxolane derivatives, benzilketals, α,α-dialkoxyacetophenones, α-hydroxy alkyl phenones, and α-aminoalkylphenones. The UV photoinitiators are not water-soluble and are generally dissolved in a hydrophilic organic solvent or mixture thereof before being added to the rest of the processing solution.

Representative UV photoinitiators 2-benzyl-2-dimethylamino-1-(4-morpholinophenyl)-butan-1-one, α,α-dimethoxy-α-hydroxy acetophenone, 1-(4-isopropylphenyl)-2-hydroxy-2-methyl-propan-1-one, 1-[4-(2-hydroxyethyloxy)phenyl]-2-hydroxy-2-methyl-propan-1-one, benzophenone, 1-hydroxy-cyclohexyl-phenyl ketone, 2,4,6-trimethylbenzoyldiphenyl-phosphine oxide, 4-methyl benzophenone, and benzil. Mixtures of these can be used if desired.

The UV photoinitiator is generally present in the processing solution in an amount of from about 0.001 to about 1 weight %, or from about 0.002 to about 0.1 weight %.

Yellow dyes that may be present in the processing solution are generally water-soluble and must absorb in the region of from about 300 to about 450 nm, and are used in an amount of from about 0.005% to about 5% of the total solution weight. Examples of useful water-soluble yellow dyes include but are not limited to, Primulin and Mordant Yellow 10 that are commercially available.

The processing solution may also include one or more color contrast dyes to provide visual evidence of the image before printing. Such color contrast dyes are well known in the art and include for example, Crystal Violet, and can be present in an amount of from about 0.001% to about 2% of the total solution weight.

The processing solution can further comprise a hydrophilic, non-volatile compound that helps stabilize the hydrophilic properties of the printing plate background. Such compounds include but not limited to, gum Arabic, carboxy methyl cellulose, a poly(vinyl alcohol), dextrin, and a poly (vinyl pyrrolidone). These hydrophilic compounds can be present in an amount of from about 5 to about 40 weight %. One commercial solution for accomplishing this purpose is Kodak 8505 Plate Finisher.

In addition, the processing solution can also comprise one or more hydrophilic solvents that are soluble or miscible with water and include but not limited to, 2-butoxy ethanol, 2-butoxy propanol, ethyl lactate, diacetone alcohol, monoethylene glycol, diethylene glycol, and ethylene glycol butyl ether. Such hydrophilic solvents can be present in an amount of from about 1 to about 10 weight %.

Yet again, the processing solution can also include an amine that can take up unreacted peroxide radicals to increase the polymerization efficiency. Examples of such compounds include but not limited to, ethanolamine (such as triethanolamine, methyl diethanolamine, and dibutyl ethanolamine), and trialkylamines (such as trimethylamine and triethylamine). This compound can be present in an amount of from about 0.1 to about 5 weight %.

Post-development UV curing can be achieved using for example, using 3 30 W fluorescent lamps having a primary emission wavelength of 365 nm using elliptical reflectors. As the exposure is arranged "in-line", it is coordinated with the dip speed in the processing unit and the printing plates then pass underneath the lamps at speeds corresponding to the processing dip times of from about 10 to about 60 seconds, or typically from about 30 to about 40 seconds. This technique is a representative method for UV curing but it is not intended that the invention is limited to it.

During printing, a fountain solution is taken up by the non-imaged regions, that is, the surface of the hydrophilic substrate revealed by the imaging and development steps, and ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged printing plate to the receiving material. The printing plates can be cleaned between impressions, if desired, using conventional cleaning means.

The present invention provides at least the following embodiments:

Embodiment 1

A method of providing a lithographic printing plate comprising:
A) contacting an infrared radiation-imaged negative-working lithographic printing plate precursor with a processing solution having a pH less than 9 and comprising a UV photoinitiator, to provide a lithographic printing plate, and
B) floodwise exposing the lithographic printing plate with UV radiation.

Embodiment 2

The method of embodiment 1 wherein the processing solution has a pH of from about 4 to about 7.

Embodiment 3

The method of embodiment 1 or 2 wherein the lithographic printing plate is heated prior between steps A and B.

Embodiment 4

The method of any of embodiments 1 to 3 wherein the processing solution has a pH of from about 4 to about 6.

Embodiment 5

The method of any of embodiments 1 to 4 wherein the processing solution further comprises a hydrophilic compound.

Embodiment 6

The method of embodiment 5 wherein the hydrophilic compound includes one or more of gum Arabic, carboxy methyl cellulose, a poly(vinyl alcohol), dextrin, and a poly (vinyl pyrrolidone).

Embodiment 7

The method of any of embodiments 1 to 6 wherein the processing solution further comprises a non-volatile hydrophilic solvent.

Embodiment 8

The method of embodiment 7 wherein the hydrophilic solvent includes one or more of 2-butoxy ethanol, 2-butoxy

21 propanol, ethyl lactate, diacetone alcohol, monoethylene glycol, diethylene glycol, and ethylene glycol butyl ether.

Embodiment 9

The method of any of embodiments 1 to 8 wherein the UV photoinitiator is present in the processing solution in an amount of from about 0.001 to about 1 weight %.

Embodiment 10

The method of any of embodiments 1 to 9 wherein the processing solution further comprises an amine.

Embodiment 11

The method of embodiment 10 wherein the amine is an ethanolamine or trialkylamine.

Embodiment 12

The method of any of embodiments 1 to 11 wherein the UV photoinitiator has a sensitivity at a $\lambda_{max}$ of from about 300 to about 450 nm.

Embodiment 13

The method of any of embodiments 1 to 12 wherein the UV photoinitiator includes one or more of 2-benzyl-2-dimethylamino-1-(4-morpholinophenyl)-butan-1-one, α,α-dimethoxy-α-hydroxy acetophenone, 1-(4-isopropylphenyl)-2-hydroxy-2-methyl-propan-1-one, 1-[4-(2-hydroxyethyloxy)phenyl]-2-hydroxy-2-methyl-propan-1-one, benzophenone, 1-hydroxy-cyclohexyl-phenyl ketone, 2,4,6-trimethylbenzoyldiphenyl-phosphine oxide, 4-methyl benzophenone, and benzil.

Embodiment 14

The method of any of embodiments 1 to 13 wherein the processing solution further includes a yellow dye.

Embodiment 15

A method of providing a lithographic printing plate comprising:
A) imagewise exposing a negative-working lithographic printing plate precursor to infrared radiation to provide exposed and non-exposed regions,
B) contacting the exposed lithographic printing plate precursor with a processing solution having a pH less than 9 and comprising a UV photoinitiator, to provide a lithographic printing plate, and
C) floodwise exposing the lithographic printing plate with UV radiation.

Embodiment 16

The method of embodiment 15 wherein the imagewise exposing is carried out using exposure energy of less than 300 mJ/cm².

Embodiment 17

The method of embodiment 15 or 16 wherein step A or step B, or both steps A and B, are carried out on-press.

Embodiment 18

The method of any of embodiments 15 to 17 wherein the processing solution has a pH of from about 4 to about 6 and

22 comprises a one or more of 2-benzyl-2-dimethylamino-1-(4-morpholinophenyl)-butan-1-one, α,α-dimethoxy-α-hydroxy acetophenone, 1-(4-isopropylphenyl)-2-hydroxy-2-methyl-propan-1-one, 1-[4-(2-hydroxyethyloxy)phenyl]-2-hydroxy-2-methyl-propan-1-one, benzophenone, 1-hydroxy-cyclohexyl-phenyl ketone, 2,4,6-trimethylbenzoyldiphenyl-phosphine oxide, 4-methyl benzophenone, and benzil as the UV photoinitiator in an amount of from about 0.001 to about 1 weight %.

Embodiment 19

The method of any of embodiments 15 to 18 wherein the lithographic printing plate precursor comprises an infrared radiation-sensitive imageable layer comprising an initiator composition that is capable of providing free radicals upon exposure to infrared radiation.

Embodiment 20

The method of any of embodiments 15 to 19 wherein the lithographic printing plate precursor further comprises a compound in the imageable layer that is capable of being polymerized by the UV photoinitiator in the processing solution.

Embodiment 21

The method of any of embodiments 15 to 20 wherein the processing solution further includes a yellow dye.

The following examples are provided to illustrate the practice of the invention but are by no means intended to limit the invention in any manner.

Examples

In all of the following examples, All Star Fount 3% (ABC Chemical Co., Lancaster, UK) and Bestack Ink (Best One Co., Japan) were used during printing. The processing solution pH was about 5.4.

Comparative Example 1

Samples of negative-working lithographic printing plate precursors described in U.S. Pat. No. 7,261,998 (Hayashi et al.) were evaluated. This printing plate precursor has a recommended sensitivity of 320 mJ/cm² when imaged on a commercially available Quantum 400 CTP (computer-to-plate) that uses an 830 nm wavelength array of infrared lasers for digitally imaging. For comparison purposes, samples were imaged at 320 mJ/cm², 250 mJ/cm², and 150 mJ/cm². The imaged elements were placed directly onto a Heidelberg GTO printing press and used for printing impression using a fountain solution and a commercial lithographic printing ink. The printing plates were inked up with several rotations and then impressions were taken. The first impressions showed background on the non-exposed (non-imaged) areas but this gradually cleared. After 200 impressions, the images created at 320 mJ/cm² and 250 mJ/cm² were clearly visible, but no image appeared at 150 mJ/cm². After 10,000 impressions, the lighter areas of the 250 mJ/cm² exposed areas showed great deterioration although the 320 mJ/cm² was still intact.

Comparative Example 2

Samples of the negative-working printing plate precursors described in Comparative Example 1 were imaged and processed by passing them through a standard processor containing a solution of 60% of gum, 6.2% of 2-butoxyethanol, 0.03% of Irgacure® 369 photoinitiator, and 33.77% of deionised water (all percentages by weight). After processing, the resulting lithographic printing plates showed clearer images than before processing because all of the non-exposed (non-imaged) background coating had been removed. The printing plates were then put on a press and from initial impressions did not exhibit any background, showing that the plate was fully processed by the above processing liquid. The printing performance was identical to that of the printing plates developed on press in Comparative Example 1.

Comparative Example 3

Other samples of negative-working printing plate precursors described in Comparative Example 1 were imaged and processed by passing them through a standard processor containing the a solution of 60% gum, 6.2% 2-butoxyethanol, and 33.77% deionized water (all percentages by weight). After processing the printing plates showed an identical visual image to those prepared as in Comparative Example 2. Note that the difference between the processing liquid of this example and that of Comparative Example 2 is that this processing solution contained no photoinitiator. The processed samples were immediately floodwise exposed to UV light and then put onto a printing press. The initial impressions did not exhibit any background, showing that the printing plates were fully processed. The printing performance was slightly superior to that of the printing plate developed on-press in Comparative Example 1, showing the surprising result that even without photoinitiator some hardening of the image areas occurs and is translated into a slight increase in image sensitivity and run length. Further increase in the UV floodwise exposure caused background to appear on the printed copies and this cannot be eliminated. This suggests that some residual material is left on the printing plate and that this becomes oleophilic during UV curing.

Invention Example 1

Additional samples of the negative-working printing plate precursors described in Comparative Example 1 were imaged and processed exactly as in Comparative Example 2 but after processing it was immediately floodwise exposed to UV light. During printing, the first impressions had clean background, but only a faint image upon exposure at 150 mJ/cm$^2$. could be seen. This indicates that the UV exposure had hardened the imaged areas. However, 150,000 excellent impressions were obtained after imaging exposure at 250 mJ/cm$^2$. Although it is possible to over expose with the UV irradiation, causing a background, it is possible to find a desired combination of processing liquid, processing time and temperature, and imaging exposure energy that provide excellent image results and long run length.

Invention Example 2

This example demonstrates the practice of this invention using a processing solution (pH 5.4) containing Kodak 8505 Plate Finisher (30%), water (48.2%), monoethylene glycol (16%), triethanolamine (0.4%), 2-butoxyethanol (5%), citric acid (0.3%), Mordant Yellow 10 (0.2%), and Irgacure® 369 photoinitiator (0.1%), all percentages by weight.

This processing solution was used in the manner described in Invention Example 1, and the processor was run at a large selection of speeds, giving combinations of dip time and UV exposure time without causing background on the resulting printed impressions.

The invention has been described in detail with particular reference to certain preferred embodiments thereof, but it will be understood that variations and modifications can be effected within the spirit and scope of the invention.

The invention claimed is:

1. A method of providing a lithographic printing plate comprising:
    A) contacting an infrared radiation-imaged negative-working lithographic printing plate precursor with a processing solution having a pH less than 9 and comprising a UV photoinitiator, to provide a lithographic printing plate, and
    B) floodwise exposing said lithographic printing plate with UV radiation.
2. The method of claim 1 wherein said processing solution has a pH of from about 4 to about 7.
3. The method of claim 1 wherein said lithographic printing plate is heated between steps A and B.
4. The method of claim 1 wherein said processing solution has a pH of from about 4 to about 6.
5. The method of claim 1 wherein said processing solution further comprises a non-volatile hydrophilic compound.
6. The method of claim 5 wherein said hydrophilic compound includes one or more of gum Arabic, carboxy methyl cellulose, a poly(vinyl alcohol), dextrin, and a poly(vinyl pyrrolidone).
7. The method of claim 1 wherein said processing solution further comprises a hydrophilic solvent.
8. The method of claim 7 wherein said hydrophilic solvent includes one or more of 2-butoxy ethanol, 2-butoxy propanol, ethyl lactate, diacetone alcohol, monoethylene glycol, diethylene glycol, and ethylene glycol butyl ether.
9. The method of claim 1 wherein said UV photoinitiator is present in said processing solution in an amount of from about 0.001 to about 1 weight %.
10. The method of claim 1 wherein said processing solution further comprises an amine.
11. The method of claim 10 wherein said amine is an ethanolamine or trialkylamine.
12. The method of claim 1 wherein said UV photoinitiator has a sensitivity at a $\lambda_{max}$ of from about 300 to about 450 nm.
13. The method of claim 1 wherein said UV photoinitiator comprises one or more compounds selected from the group consisting of 2-benzyl-2-dimethylamino-1-(4-morpholinophenyl)-butan-1-one, α,α-dimethoxy-α-hydroxy acetophenone, 1-(4-isopropylphenyl)-2-hydroxy-2-methyl-propan-1-one, 1-[4-(2-hydroxyethyloxy)phenyl]-2-hydroxy-2-methyl-propan-1-one, benzophenone, 1-hydroxy-cyclohexyl-phenyl ketone, 2,4,6-trimethylbenzoyldiphenyl-phosphine oxide, 4-methyl benzophenone, and benzil.
14. The method of claim 1 wherein said processing solution further includes a water-soluble yellow dye.
15. A method of providing a lithographic printing plate comprising:
    A) imagewise exposing a negative-working lithographic printing plate precursor to infrared radiation to provide exposed and non-exposed regions,
    B) contacting said exposed lithographic printing plate precursor with a processing solution having a pH less than 9 and comprising a UV photoinitiator, to provide a lithographic printing plate, and
    C) floodwise exposing said lithographic printing plate with UV radiation.

16. The method of claim 15 wherein said imagewise exposing is carried out using exposure energy of less than 300 mJ/cm$^2$.

17. The method of claim 15 wherein step A or step B, or both steps A and B, are carried out on-press.

18. The method of claim 15 wherein said processing solution has a pH of from about 4 to about 6 and comprises a one or more UV photoinitiators selected from the group consisting of 2-benzyl-2-dimethylamino-1-(4-morpholinophenyl)-butan-1-one, α,α-dimethoxy-α-hydroxy acetophenone, 1-(4-isopropylphenyl)-2-hydroxy-2-methyl-propan-1-one, 1-[4-(2-hydroxyethyloxy)phenyl]-2-hydroxy-2-methyl-propan-1-one, benzophenone, 1-hydroxy-cyclohexyl-phenyl ketone, 2,4,6-trimethylbenzoyldiphenyl-phosphine oxide, 4-methyl benzophenone, and benzyl, in an amount of from about 0.001 to about 1 weight %.

19. The method of claim 15 wherein said lithographic printing plate precursor comprises an infrared radiation-sensitive imageable layer comprising an initiator composition that is capable of providing free radicals upon exposure to infrared radiation.

20. The method of claim 19 wherein said lithographic printing plate precursor further comprises a compound in said infrared radiation-sensitive imageable layer that is capable of being polymerized by said UV photoinitiator in said processing solution.

21. The method of claim 15 wherein said processing solution also includes a water-soluble yellow dye.

\* \* \* \* \*